US007924564B1

(12) United States Patent
Wilson

(10) Patent No.: US 7,924,564 B1
(45) Date of Patent: Apr. 12, 2011

(54) INTEGRATED ANTENNA STRUCTURE WITH AN EMBEDDED COOLING CHANNEL

(75) Inventor: James S. Wilson, Hurst, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/609,949

(22) Filed: Oct. 30, 2009

(51) Int. Cl.
*H05K 7/20* (2006.01)

(52) U.S. Cl. ....... 361/699; 361/689; 361/700; 165/80.4; 165/104.33; 257/714; 257/715

(58) Field of Classification Search ........................ None
See application file for complete search history.

(56) References Cited

U.S. PATENT DOCUMENTS 3,553,702 A 1/1971 Spanos
5,128,689 A * 7/1992 Wong et al. .................... 343/853
6,292,364 B1 * 9/2001 Fitzgerald et al. ............ 361/699
6,584,332 B2 * 6/2003 Yoshitake et al. ............ 505/210
6,664,928 B2 * 12/2003 Ogawa et al. .......... 343/700 MS
6,952,345 B2 * 10/2005 Weber et al. .................. 361/699
6,957,550 B2 * 10/2005 Wyatt et al. ...................... 62/475
7,000,691 B1 * 2/2006 Weber ............................ 165/281
7,061,446 B1 6/2006 Short, Jr. et al.
7,391,382 B1 * 6/2008 Mason et al. ................. 343/754
7,454,920 B2 * 11/2008 Haws ............................ 62/176.6
7,808,781 B2 * 10/2010 Colgan et al. ................ 361/699
2007/0014090 A1 1/2007 Weber et al.
2009/0084527 A1 4/2009 Rummel et al.

OTHER PUBLICATIONS

European Search Report for Application No. 10189266.9-2220; from EPO; 6 pages, Dec. 29, 2010.

* cited by examiner

*Primary Examiner* — Boris L Chervinsky
(74) *Attorney, Agent, or Firm* — Baker Botts L.L.P.

(57) ABSTRACT

According to one embodiment of the disclosure, an integrated antenna structure comprises a plurality of radiating elements, cooling channels embedded directly within each of the plurality of radiating elements, a fluid inlet, and a fluid outlet. Each of the plurality of radiating elements receive or transmit electromagnetic energy. The cooling channels are formed by an internal surface of the radiating elements. The fluid inlet and the fluid outlet are in communication with each of the cooling channels. Each of the cooling channels provides a heat exchanging function by receiving at least a portion of a fluid coolant from the fluid inlet, transferring a least a portion of the thermal energy from the respective radiating element to the received portion of the fluid coolant, and dispensing of at least a portion of the received fluid coolant out of the cooling channel to the fluid outlet.

20 Claims, 3 Drawing Sheets

INTEGRATED ANTENNA STRUCTURE WITH AN EMBEDDED COOLING CHANNEL

TECHNICAL FIELD OF THE DISCLOSURE

This disclosure relates generally to the field of cooling systems and, more particularly, to an integrated antenna structure with an imbedded cooling channel.

BACKGROUND OF THE DISCLOSURE

A variety of different types of structures can generate heat or thermal energy in operation. To prevent such structures from over heating, a variety of different types of cooling systems may be utilized to dissipate the thermal energy, including cold plates.

SUMMARY OF THE DISCLOSURE

According to one embodiment of the disclosure, an integrated antenna structure comprises a plurality of radiating elements, cooling channels embedded directly within each of the plurality of radiating elements, a fluid inlet, and a fluid outlet. Each of the plurality of radiating elements receive or transmit electromagnetic energy. The cooling channels are formed by an internal surface of the radiating elements. The fluid inlet and the fluid outlet are in communication with each of the cooling channels. Each of the cooling channels provides a heat exchanging function by receiving at least a portion of a fluid coolant from the fluid inlet, transferring a least a portion of the thermal energy from the respective radiating element to the received portion of the fluid coolant, and dispensing of at least a portion of the received fluid coolant out of the cooling channel to the fluid outlet.

Certain embodiments of the disclosure may provide numerous technical advantages. For example, a technical advantage of one embodiment may include the capability to minimize a thermal path for heat produced within an antenna structure, thereby providing better thermal control both locally and at the antenna structure level. Other technical advantages of other embodiments may include the capability to minimize the weight of the integrated antenna structure by having the heat exchanger form part of the antenna. Yet other technical advantages of other embodiments may include the capability to minimize the number of parts to build the integrated antenna structure. Still yet other technical advantages of other embodiments may include the capability to minimize the overall packaging volume required for the integrated antenna structure.

Although specific advantages have been enumerated above, various embodiments may include all, some, or none of the enumerated advantages. Additionally, other technical advantages may become readily apparent to one of ordinary skill in the art after review of the following figures and description.

BRIEF DESCRIPTION OF THE DRAWINGS

For a more complete understanding of example embodiments of the present disclosure and its advantages, reference is now made to the following description, taken in conjunction with the accompanying drawings, in which.

DETAILED DESCRIPTION OF THE DISCLOSURE

It should be understood at the outset that although example embodiments of the present disclosure are illustrated below, the present disclosure may be implemented using any number of techniques, whether currently known or in existence or not. The present disclosure should in no way be limited to the example embodiments, drawings, and techniques illustrated below, including the embodiments and implementation illustrated and described herein. Additionally, the drawings are not necessarily drawn to scale.

Antennas exposed to adverse temperature conditions can experience undesired structural distortions. In turn, such structural distortions can degrade radio frequency performance—especially when the desired performance is dependent on maintaining tight tolerance control of gaps and/or features within radiating elements of the antenna. Attempts to combat such thermal distortions typically involve use of separate coldplates. However, there is often little or no room for such coldplates. Given such difficulties, teachings of certain embodiments recognize cooling features that can be embedded directly into radiating elements of an antenna.

Figure 1:
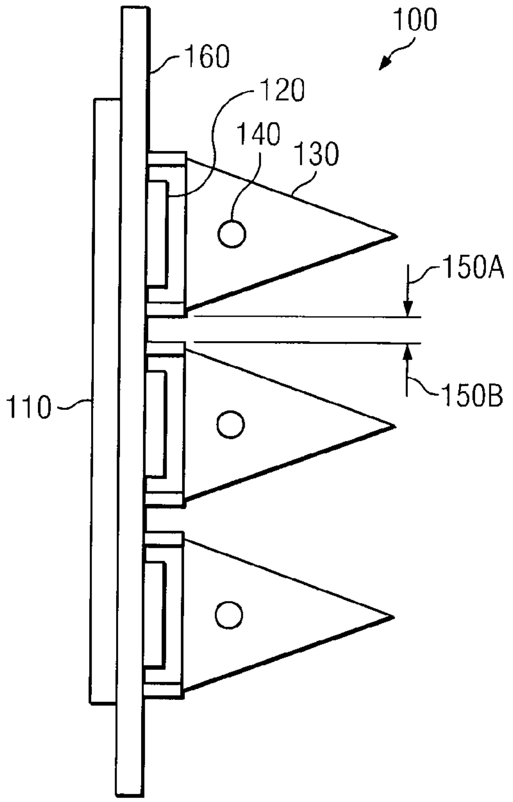
FIG. 1 illustrates a system with integrated cooling, according to one embodiment.

FIG. 1 illustrates a system 100 with integrated cooling, according to one embodiment. The system 100 of FIG. 1 includes electronics 110, electronics 120, board 160, a plurality of radiating elements 130, and a plurality of cooling channels 140.

The electronics 110, 120 are generally disposed on either side of a board 160. In operation, electronics 110 may communicate with electronics 120 which, in turn, may communicate with radiating elements 130 in the receipt and transmission of electromagnetic energy or other types of energy.

In particular settings and for particular operations, the performance of the radiating elements 130 may depend on a gap (represented by arrows 150A, 150B) between radiating elements 130. However, as described above, radiating elements 130 can be exposed to temperatures, either due to the ambient environment in which the radiating elements 130 are placed or due to a receipt of thermal energy, for example from electronics, such as electronics 110, 120.

To avoid potential distortions to the radiating elements 130 and to dissipate any build up of thermal energy (sometimes referred to as heat) in the radiating elements 130, cooling channels 140 have been embedded directly into the radiating elements 130. In particular embodiments, these cooling channels 140 include fluid coolants that absorb thermal energy from the radiating elements 130 and dissipates such thermal energy to a heat sink, including, but not limited to ambient air or other suitable heat sinks. By integrating the cooling channels 140 directly into the radiating elements 130, thermal energy need only travel a very short path from the radiating element 130 to the cooling channel 140. In particular embodiments, such a thermal path may be short relative to a thermal path in which the thermal energy is transferred to a separate cold plate.

In particular embodiments, the cooling channels 140 may also absorb the dissipation of thermal energy from electronics 110 and/or 120 to avoid buildup of thermal energy in such electronics 110 and/or 120. In other embodiments, the electronics 110 and/or 120 may be thermally isolated from the radiating elements 130.

In particular embodiments, the embedding of the cooling channels 140 directly into the radiating elements 130 may allow for a tighter packing density of an integrated structure that includes system 100. Accordingly, cooling of radiating elements 130 may be accomplished in a density that would otherwise not accommodate a conventional cooling configuration, for example, using a separate cold plate.

Although not expressly shown in FIG. 1, in particular embodiments, a condenser and/or evaporator may be integrated into the system 100. Further details, in general, of an overall cooling system are provided below with reference to FIG. 4. In particular embodiments, the use of a condenser/evaporator allows precise temperature control of the structure by adjustment of the coolant phase change temperature.

In particular embodiments, the fluid traveling through the cooling channels 140 may alter the operation of the radiating elements 130. In such embodiments, the radiating elements 130 can be designed such that the fluid within the cooling channels 140 is considered to be part of the antenna, itself. In other words, in particular embodiments the cooling channels 140 (including the fluid therein) may take on an electrical function in addition to a cooling function.

In particular embodiments, in contrast to conventional designs, because the cooling channels 140 are embedded directly in the radiating elements 130 (which may form an antenna), the cooling or heat-exchanging portion of the antenna can be on a front side of an antenna structure, for example, as opposed to a back side with a conventional cold plate design. As an illustrative example, if the board 160 is the structure, and the radiating elements 130 are the antenna, the cooling or heat-exchanging portion of the antenna (as provided by the cooling channels 140) is on the front side of the board 160 or structure whereas the electronics 110 are on the back side.

Figure 2A:
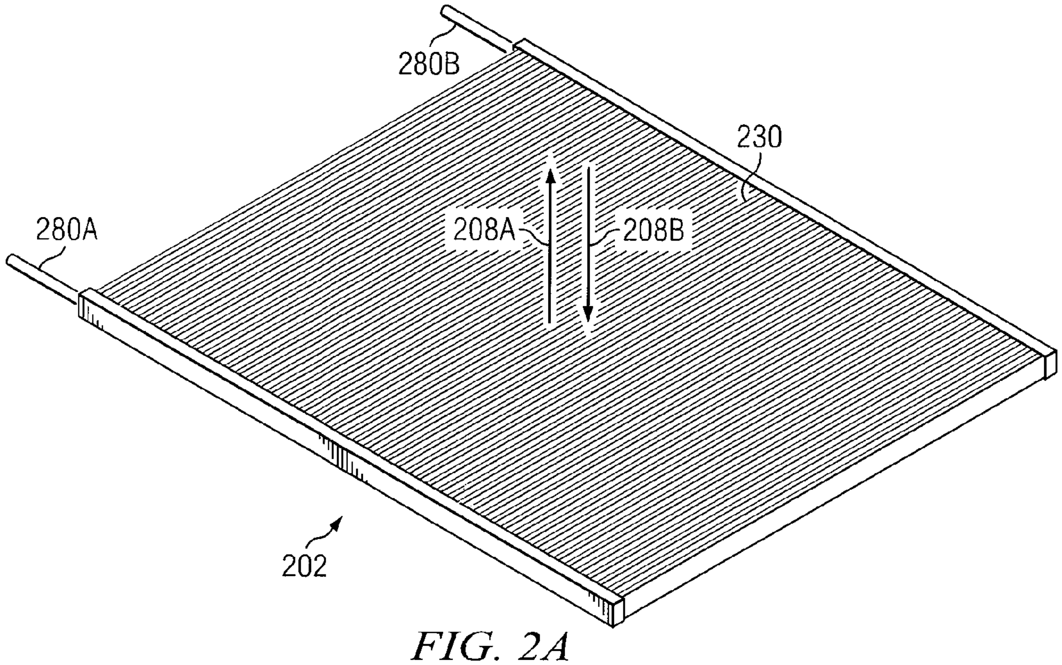
FIGS. 2A and 2B illustrate a system with integrated cooling, according to an embodiment.
Figure 2B:
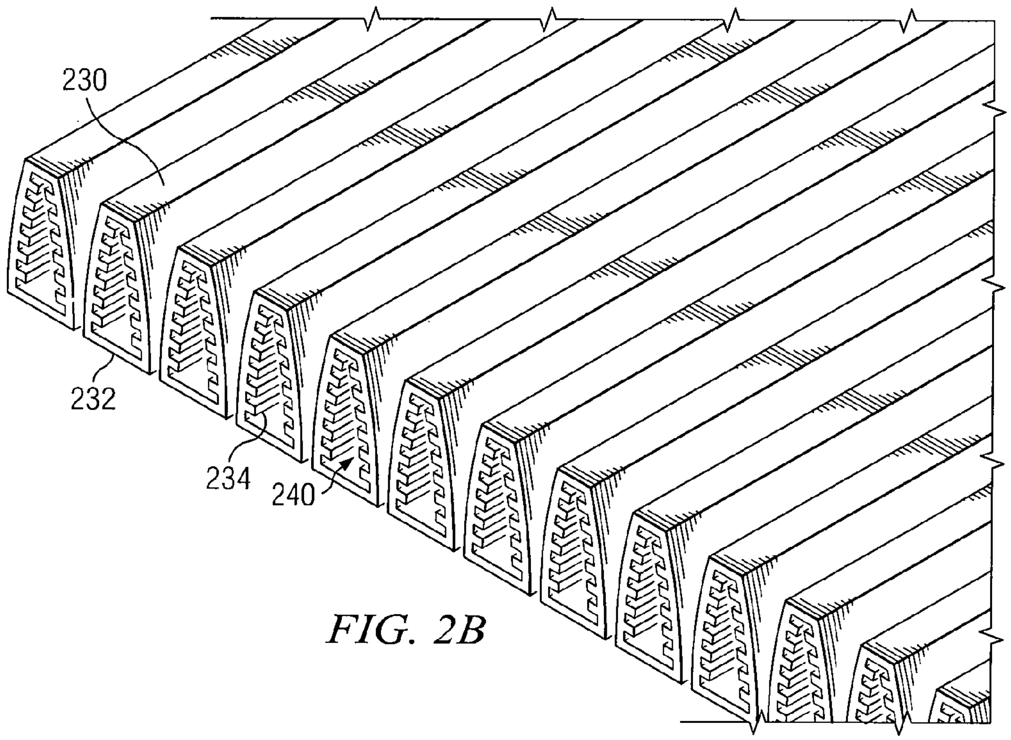

FIGS. 2A and 2B illustrate a system 200 with integrated cooling, according to an embodiment. The system 200 of FIGS. 2A and 2B may include features similar to the system 100 of FIG. 1, including radiating elements 230.

With reference to FIG. 2A, electronics (not shown) may generally be disposed on a back side of the radiating elements 230 as shown by arrow 202. The radiating elements 230 may generally transmit and receive electromagnetic energy or other types of energy as indicated by arrows 208A, 208B.

With reference to FIG. 2B, fluid channels 240 are seen embedded directly in the radiating element 230. In operation, fluid may come into direct contact with an internal surface 232 of the radiating element 230 in the fluid channels 240. As seen in FIG. 2B, the internal surface 232 of the radiating element 230 in the cooling channel 240 may additionally include surface enhancing structures 234, which may enhance the transfer of thermal energy from radiating element 230 to the fluid traveling through the fluid channel 240. For example, in particular embodiments, the surface enhancing structures 234 may increase the surface area contact between internal surface 232 of the radiating element 230 and fluid that is transmitted through the fluid channels 240. Surface enhancing structures may include any of a variety of designs including, but not limited to, pin fins or other types of fins.

With reference back to FIG. 2A, a fluid inlet 280A and a fluid outlet 280B are shown. In operation fluid may be introduced through fluid inlet 280A, and travel through the fluid channels 240 absorbing thermal energy. Then, the fluid with the absorbed thermal energy may exit the channels 240 of the radiating elements 230 through fluid outlets 280B. In particular embodiments, the fluid exiting 280B may travel to a heat exchanger, which itself absorbs thermal energy, allowing the fluid to be later reintroduced back through fluid inlet 280A in a cyclical manner. Further details of example cooling system components that may be utilized in conjunction with the system 200 of FIGS. 2A and 2B are described with reference to FIG. 4.

In particular embodiments, the fluid traveling through the channels may be a two phase fluid that is designed to vaporize upon receiving thermal energy from the radiating element 230. Thus, for example, the fluid entering the inlet 280A may be substantially in a liquid form and the fluid exiting outlet 280B may be at least partially in a vapor form. As just one non-limiting example, the fluid may be water which undergoes a boiling heat transfer in absorbing the thermal energy from the radiating elements 230. In particular embodiments, as described with reference to FIG. 4, the pressure inside the fluid channels can be manipulated to lower the boiling point of the fluid. As one example, the pressure inside the fluid channels 240 may be operating at a sub ambient pressure. Any of a variety of fluids may be used as coolants. Non-limiting examples are provided with reference to FIG. 4.

Figure 3:
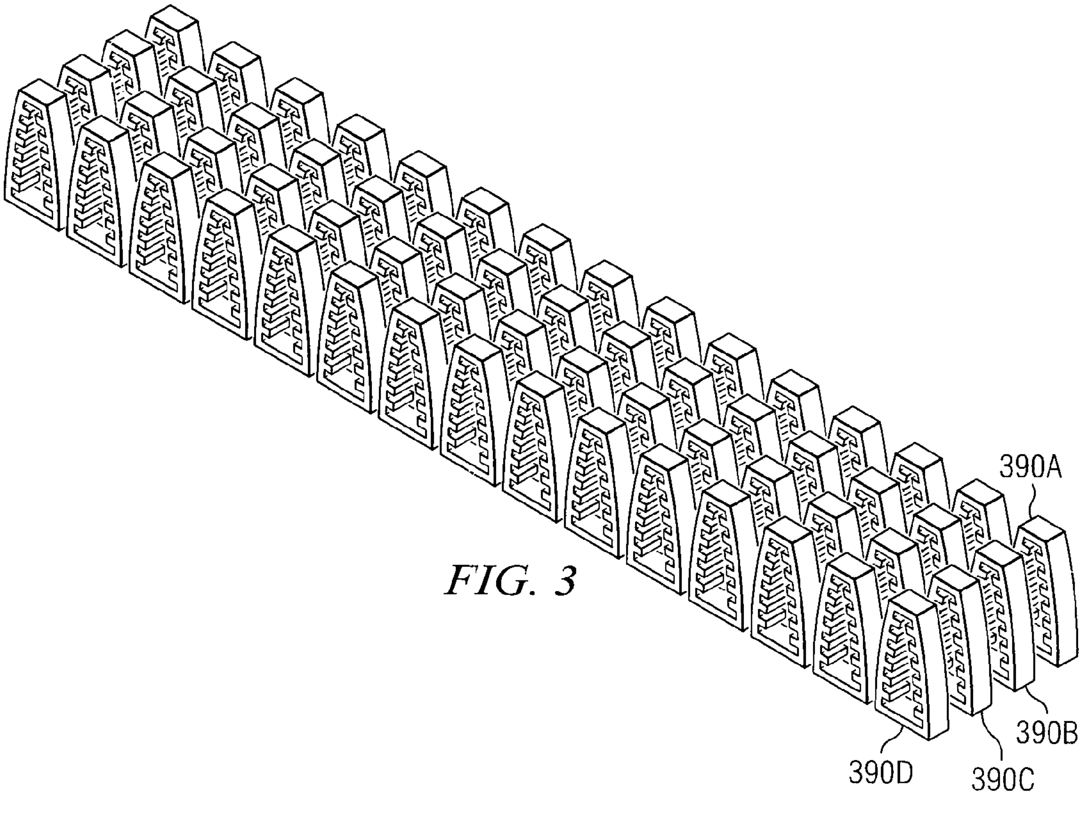
FIG. 3 shows one technique for imbedding cooling channels in a radiating element, according to an embodiment.

In particular embodiments, the channels 240 may also include wicking materials that transport liquid fluid from liquid rich areas to liquid poor areas. Using such a wicking material, vaporized liquid fluid would be replaced by additional liquid fluid. The wicking material may include both metallic and non-metallic materials. Examples of the wicking material may include embodiments described by U.S. patent application Ser. No. 11/773,267, entitled System and Method for Passive Cooling Using a Non-Metallic Wick, filed Jul. 3, 2007. U.S. patent application Ser. No. 11/773,267, which is hereby incorporated by reference FIG. 3 shows one technique for imbedding cooling channels in a radiating element, according to an embodiment. In FIG. 3, four separate sheets 390A, 390B, 390C, and 390D are shown; however, more than four sheets may be utilized. In operation, each respective sheet 390A, 390B, 390C, and 390D can be etched as shown to have the respective portion of a cooling channel embedded therein, along with, for example, a surface enhancing structure.

Any suitable etching technique may be utilized. After etching, the sheets 390A, 390B, 390C, and 390D can be bonded to one another. As one non-limiting example, the sheets 390A, 390B, 390C, and 390D can be fusion bonded to one another. After bonding the sheets to one another, the system may take on an appearance such as that shown in FIGS. 2A and 2B.

Figure 4:
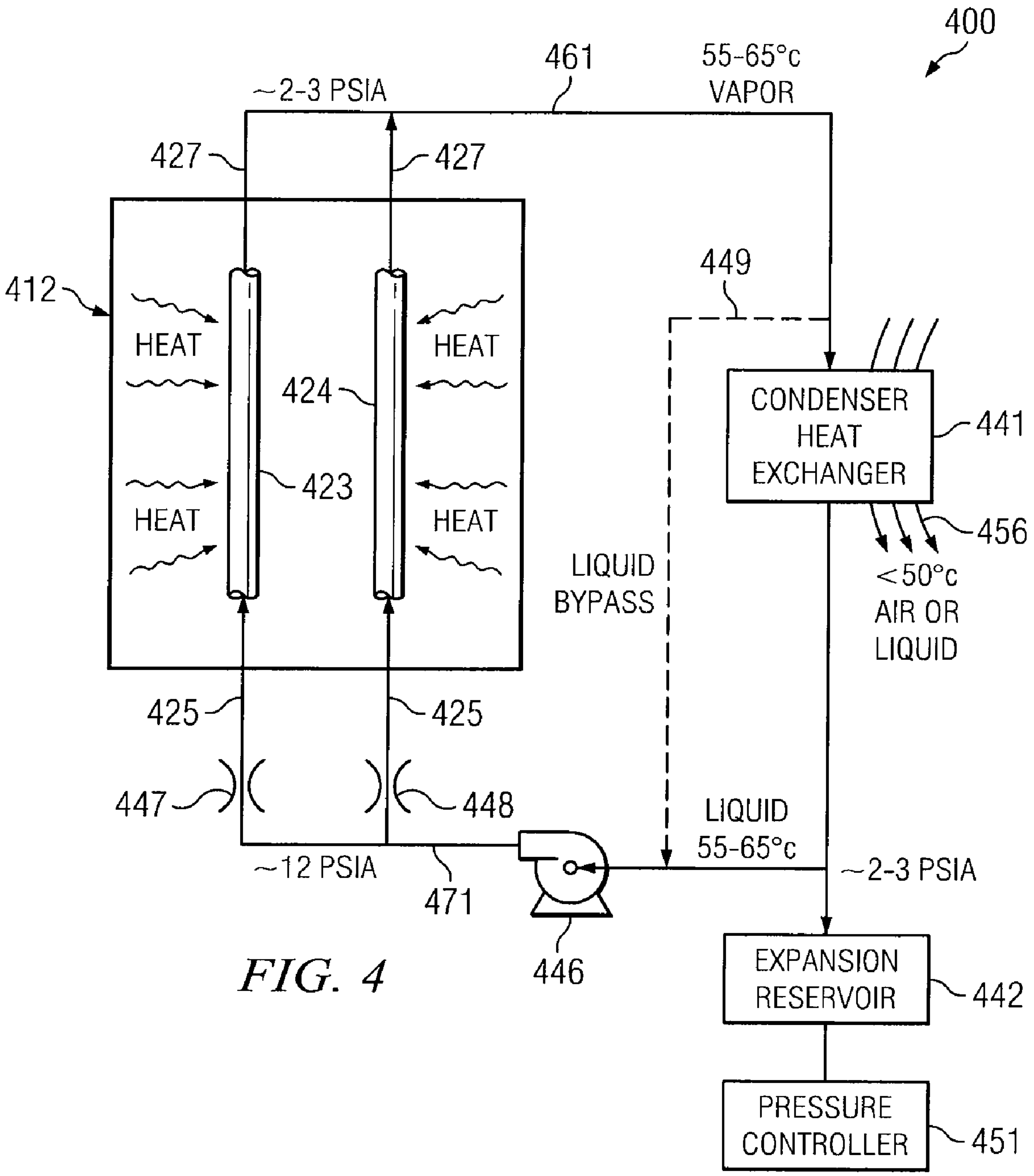
FIG. 4 is a block diagram of an embodiment of components of a cooling system that may be utilized in conjunction with other embodiments disclosed herein.

FIG. 4 is a block diagram of an embodiment of components of a cooling system 400 that may be utilized in conjunction with other embodiments disclosed herein. Although the details of components of a particular cooling system will be described below, it should be expressly understood that other cooling systems may be used in conjunction with embodiments of the invention. Additionally, the cooling systems of the other embodiments described herein may utilize some, none, or all of the components of the cooling system of FIG. 4.

The cooling system 400 of FIG. 4 is shown cooling a structure 412 that is exposed to or generates thermal energy. This structure, for example, may be the radiating elements 130, 230 of FIGS. 1, 2A, and 2B.

The cooling system 400 of FIG. 4 includes a vapor line 461, a liquid line 471, heat exchangers 423 and 424, a pump 446, inlet orifices 447 and 448, a condenser heat exchanger 441, an expansion reservoir 442, and a pressure controller 451.

The heat exchangers 423, 424 may correspond to the fluid channels 140, 240 of FIGS. 1, 2A, and 2B, absorbing thermal energy from the structure 412 (e.g., the radiating elements 130, 230 of FIGS. 1, 2A, and 2B).

In operation, a fluid coolant flows through each of the heat exchangers 423, 424. As discussed later, this fluid coolant may be a two-phase fluid coolant, which enters inlet conduits 425 of heat exchangers 423, 424 in liquid form. Absorption of heat from the structure 412 causes part or all of the liquid coolant to boil and vaporize such that some or all of the fluid coolant leaves the exit conduits 427 of heat exchangers 423, 424 in a vapor phase. To facilitate such absorption or transfer of thermal energy, the heat exchangers 423, 424 may be lined with pin fins or other similar devices which, among other things, increase surface contact between the fluid coolant and walls of the heat exchangers 423, 424.

In particular embodiments, the fluid inlet 280A of FIG. 2A may correspond to inlet conduit 425 of FIG. 4 and the fluid outlet 280B of FIG. 2A may correspond to exit conduit 427 of FIG. 4.

The fluid coolant may depart the exit conduits 427 and flow through the vapor line 461, the condenser heat exchanger 441, the expansion reservoir 442, a pump 446, the liquid line 471, and a respective one of two orifices 447 and 448, in order to again to reach the inlet conduits 425 of the heat exchanger 423, 424. The pump 446 may cause the fluid coolant to circulate around the loop shown in FIG. 4. Although the vapor line 461 uses the term "vapor" and the liquid line 471 uses the terms "liquid", each respective line may have fluid in a different phase. For example, the liquid line 471 may have contain some vapor and the vapor line 461 may contain some liquid.

The orifices 447 and 448 in particular embodiments may facilitate proper partitioning of the fluid coolant among the respective heat exchanger 423, 424, and may also help to create a large pressure drop between the output of the pump 446 and the heat exchanger 423, 424 in which the fluid coolant vaporizes. The orifices 447 and 448 may have the same size, or may have different sizes in order to partition the coolant in a proportional manner which facilitates a desired cooling profile.

A flow 456 of fluid (either gas or liquid) may be forced to flow through the condenser heat exchanger 441, for example by a fan (not shown) or other suitable device. In particular embodiments, the flow 456 of fluid may be ambient fluid. The condenser heat exchanger 441 transfers heat from the fluid coolant to the flow 456 of ambient fluid, thereby causing any portion of the fluid coolant which is in the vapor phase to condense back into a liquid phase. In particular embodiments, a liquid bypass 449 may be provided for liquid fluid coolant that either may have exited the heat exchangers 423, 424 or that may have condensed from vapor fluid coolant during travel to the condenser heat exchanger 441. In particular embodiments, the condenser heat exchanger 441 may be a cooling tower.

In particular configurations, the liquid fluid coolant exiting the condenser heat exchanger 441 may be supplied to the expansion reservoir 442. Since fluids typically take up more volume in their vapor phase than in their liquid phase, the expansion reservoir 442 may be provided in order to take up the volume of liquid fluid coolant that is displaced when some or all of the coolant in the system changes from its liquid phase to its vapor phase. The amount of the fluid coolant which is in its vapor phase can vary over time, due in part to the fact that the amount of heat or thermal energy being produced by the structure 412 will vary over time, as the structure 412 operates in various operational modes.

Turning now in more detail to the fluid coolant, one highly efficient technique for removing heat from a surface is to boil and vaporize a liquid which is in contact with a surface. As the liquid vaporizes in this process, it inherently absorbs heat to effectuate such vaporization. The amount of heat that can be absorbed per unit volume of a liquid is commonly known as the latent heat of vaporization of the liquid. The higher the latent heat of vaporization, the larger the amount of heat that can be absorbed per unit volume of liquid being vaporized.

The fluid coolant used in the embodiment of FIG. 4 and other embodiments may include, but is not limited to, mixtures of antifreeze and water or water, alone. In particular embodiments, the antifreeze may be ethylene glycol, propylene glycol, methanol, or other suitable antifreeze. In other embodiments, the mixture may also include fluoroinerts. For example, in particular embodiment in which the system is operating at a higher pressure, R134a or other suitable fluids may be utilized. In particular embodiments, the fluid coolant may absorb a substantial amount of heat as it vaporizes, and thus may have a very high latent heat of vaporization.

Water boils at a temperature of approximately 100° C. at an atmospheric pressure of 14.7 pounds per square inch absolute (psia). In particular embodiments, the fluid coolant's boiling temperature may be reduced to between 55-65° C. by subjecting the fluid coolant to a subambient pressure of about 2-3 psia. Thus, in the cooling system 400 of FIG. 1, the orifices 447 and 448 may permit the pressure of the fluid coolant downstream from them to be substantially less than the fluid coolant pressure between the pump 446 and the orifices 447 and 448, which in this embodiment is shown as approximately 12 psia. The pressure controller 451 maintains the coolant at a pressure of approximately 2-3 psia along the portion of the loop which extends from the orifices 447 and 448 to the pump 446, in particular through the heat exchangers 423 and 424, the condenser heat exchanger 441, and the expansion reservoir 442. In particular embodiments, a metal bellows may be used in the expansion reservoir 442, connected to the loop using brazed joints. In particular embodiments, the pressure controller 451 may control loop pressure by using a motor driven linear actuator that is part of the metal bellows of the expansion reservoir 442 or by using small gear pump to evacuate the loop to the desired pressure level. The fluid coolant removed may be stored in the metal bellows whose fluid connects are brazed. In other configurations, the pressure controller 451 may utilize other suitable devices capable of controlling pressure.

In particular embodiments, the fluid coolant flowing from the pump 446 to the orifices 447 and 448 through liquid line 471 may have a temperature of approximately 55° C. to 65° C. and a pressure of approximately 12 psia as referenced above. After passing through the orifices 447 and 448, the fluid coolant may still have a temperature of approximately 55° C. to 65° C., but may also have a lower pressure in the range about 2 psia to 3 psia. Due to this reduced pressure, some or all of the fluid coolant will boil or vaporize as it passes through and absorbs heat from the heat exchanger 423 and 424.

After exiting the exits ports 427 of the heat exchanger 423, 424, the subambient coolant vapor travels through the vapor line 461 to the condenser heat exchanger 441 where heat or thermal energy can be transferred from the subambient fluid coolant to the flow 456 of fluid. The flow 456 of fluid in particular embodiments may have a temperature of less than 50° C. In other embodiments, the flow 456 may have a temperature of less than 40° C. As heat is removed from the fluid coolant, any portion of the fluid which is in its vapor phase will condense such that substantially all of the fluid coolant will be in liquid form when it exits the condenser heat exchanger 441. At this point, the fluid coolant may have a temperature of approximately 55° C. to 65° C. and a subambient pressure of approximately 2 psia to 3 psia. The fluid coolant may then flow to pump 446, which in particular embodiments 446 may increase the pressure of the fluid coolant to a value in the range of approximately 12 psia, as mentioned earlier. Prior to the pump 446, there may be a fluid connection to an expansion reservoir 442 which, when used in conjunction with the pressure controller 451, can control the pressure within the cooling loop.

Although specific examples have been provided above, it should be understood that variations may occur. For example, in particular embodiments, the cooling system may be designed to operate at a desired boiling point, but with a positive pressured system. Additionally, it should be noted that the embodiment of FIG. 4 may operate without a refrigeration system. Additionally, although particular temperatures or pressures are provided above, the system 400 may operate at other temperature and pressures.

Modifications, additions, or omissions may be made to the systems and apparatuses described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. Additionally, operations of the systems and apparatuses may be performed using any suitable logic. As used in this document, "each" refers to each member of a set or each member of a subset of a set.

Although several embodiments have been illustrated and described in detail, it will be recognized that substitutions and alterations are possible without departing from the spirit and scope of the present invention, as defined by the appended claims.

To aid the Patent Office, and any readers of any patent issued on this application in interpreting the claims appended hereto, applicants wish to note that they do not intend any of the appended claims to invoke paragraph 6 of 35 U.S.C. §112 as it exists on the date of filing hereof unless the words "means for" or "step for" are explicitly used in the particular claim.

What is claimed is:

1. An integrated antenna structure comprising:

a plurality of radiating elements, each of the plurality of radiating elements operable to receive or transmit electromagnetic energy;

a cooling channel embedded directly within each of the plurality of radiating elements, the cooling channels being formed by an internal surface of the radiating elements;

a fluid inlet in communication with each of the cooling channels; and a fluid outlet in communication with each of the cooling channels, each of the cooling channels providing a heat exchanging function by:

receiving at least a portion of a fluid coolant from the fluid inlet, transferring a least a portion of the thermal energy from the respective radiating element to the received portion of the fluid coolant, and dispensing of at least a portion of the received fluid coolant out of the cooling channel to the fluid outlet.

2. The integrated antenna structure of claim 1, further comprising:

the fluid coolant, wherein the cooling channels are operable to receive at least a portion of the fluid coolant from the fluid inlet substantially in the form of a liquid, and the cooling channels are further operable to dispense of at least a portion of the received fluid coolant to the fluid outlet at least partially in the form of vapor; and the thermal energy from the radiating elements causes the received fluid coolant in the form of a liquid to boil and vaporize in the cooling channels so that at least a portion of the received fluid coolant absorbs thermal energy from the radiating element as the at least a portion of the received fluid coolant changes state.

3. The integrated antenna structure of claim 1, further comprising:

an electronic structure in communication with each of the radiating elements; and a structure that divides the integrated antenna structure into a front side and a back side, the electronic structure being located on the back side and the radiating elements and the cooling channels being located on the front side.

4. The integrated antenna structure of claim 1, wherein each of the cooling channels include a surface enhancing structure.

5. The integrated antenna structure of claim 1, further comprising:

a wicking material embedded within each of the cooling channels.

6. The integrated antenna structure of claim 1, further comprising:

a structure to reduce a pressure of the cooling channels to a pressure that is less than an ambient pressure of an environment in which the integrated structure is contained.

7. An integrated antenna structure comprising:

a radiating element operable to receive or transmit electromagnetic energy;

a cooling channel embedded directly within the radiating element, the cooling channel providing a heat exchanging function by receiving at least a portion of a fluid coolant, transferring a least a portion of the thermal energy from the radiating element to the received fluid coolant, and dispensing of at least a portion of the received fluid coolant out of the cooling channel.

8. The integrated antenna structure of claim 7, wherein the cooling channel is formed by an internal surface of the radiating element.

9. The integrated antenna structure of claim 8, wherein the cooling channel includes a surface enhancing structure.

10. The integrated antenna structure of claim 8, further comprising:

a wicking material embedded within the cooling channel.

11. The integrated antenna structure of claim 7, further comprising:

an electronic structure in communication with the radiating element; and a structure that divides the integrated antenna structure into a front side and a back side, the electronics being located on the back side and the radiating element and the cooling channel being located on the front side.

12. The integrated antenna structure of claim 7, further comprising:

a fluid coolant;

a fluid inlet in communication with the cooling channel;

a fluid outlet in communication with the cooling channel, the cooling channel operable to receive the at least a portion of the fluid coolant from the fluid inlet substantially in the form of a liquid, and the cooling channel further operable to dispense of at least a portion of the received fluid coolant to the fluid outlet at least partially in the form of vapor; and wherein thermal energy from the radiating element causes the received fluid coolant in the form of a liquid to boil and vaporize in the cooling channel so that at least a portion of the received fluid coolant absorbs thermal energy from the radiating element as the at least a portion of the received fluid coolant changes state.

13. The integrated antenna structure of claim 7, further comprising:

a second radiating element operable to receive or transmit electromagnetic energy; and a second cooling channel embedded directly within the second radiating element, the second cooling channel providing a heat exchanging function by receiving a fluid coolant, transferring a least a portion of the thermal energy from the second radiating element to the fluid coolant, and dispensing of the fluid coolant out of the cooling channel.

14. The integrated antenna structure of claim 13, further comprising:

a fluid coolant;

a fluid inlet in communication with the cooling channel and the second cooling channel; and a fluid outlet in communication with the cooling channel and the second cooling channel, the fluid inlet operable to introduce at least a portion of the fluid coolant into each of the cooling channel and the second cooling channel, and the fluid outlet operable to receive at least a portion of the introduced fluid coolant from the cooling channel and the second cooling channel.

15. The integrated antenna structure of claim 7, wherein the cooling channel additionally provides an electrical function in forming part of the radiating element.

16. The integrated antenna structure of claim 7, further comprising:

a structure to reduce a pressure of the cooling channels to a pressure that is less than an ambient pressure of an environment in which the integrated structure is contained.

17. A method for cooling an integrated antenna structure, the method comprising:

providing a fluid coolant;

providing a cooling channel embedded directly within a radiating element of the integrated antenna structure, the radiating element operable to receive or transmit electromagnetic energy;

introducing at least a portion of the fluid coolant into the cooling channel;

dissipating at least a portion of thermal energy from the radiating element to the introduced fluid coolant in the cooling channel; and dispensing of at least a portion of the introduced fluid coolant out of the cooling channel, the dispensed fluid coolant containing the at least a portion of the thermal energy from the radiating element.

18. The method of claim 17, wherein the fluid coolant is introduced into the cooling channel substantially in the form of a liquid, and the fluid coolant is dispensed out of the coolant channel at least partially in the form of vapor; and thermal energy from the radiating element causes the fluid coolant in the form of a liquid to boil and vaporize in the cooling channel so that the fluid coolant absorbs heat from the radiating element as the fluid coolant changes state.

19. The method of claim 17, wherein the cooling channel additionally provides an electrical function in forming part of the radiating element.

20. The method of claim 17, further comprising:

reducing the cooling channel to a pressure that is less than an ambient pressure of an environment in which the integrated structure is contained.

* * * * *